(12) United States Patent
Yang et al.

(10) Patent No.: US 12,125,925 B2
(45) Date of Patent: Oct. 22, 2024

(54) THIN FILM PHOTOVOLTAIC CELL, CELL PACK AND METHOD OF FABRICATING THIN FILM PHOTOVOLTAIC CELL

(71) Applicant: TRULY SEMICONDUCTORS LTD., Guangdong (CN)

(72) Inventors: Liang Yang, Guangdong (CN); Xiongcai Xie, Guangdong (CN); Yuan Li, Guangdong (CN); Guang Huang, Guangdong (CN)

(73) Assignee: TRULY SEMICONDUCTORS LTD., Guangdong (CN)

( * ) Notice: Subject to any disclaimer, the term of this patent is extended or adjusted under 35 U.S.C. 154(b) by 0 days.

(21) Appl. No.: 18/518,397

(22) Filed: Nov. 22, 2023

(65) Prior Publication Data
US 2024/0170587 A1 May 23, 2024

(30) Foreign Application Priority Data
Nov. 23, 2022 (CN) .......................... 202211480155.0

(51) Int. Cl.
*H01L 31/0465* (2014.01)
*H01L 31/0224* (2006.01)
*H01L 31/0352* (2006.01)

(52) U.S. Cl.
CPC ............... *H01L 31/022425* (2013.01); *H01L 31/0465* (2014.12); *H01L 31/0352* (2013.01)

(58) Field of Classification Search
None
See application file for complete search history.

(56) References Cited

U.S. PATENT DOCUMENTS

| | | |
|---|---|---|
| 2011/0036393 A1 | 2/2011 | Chen et al. |
| 2012/0211060 A1 | 8/2012 | Ahn et al. |
| | (Continued) | |

FOREIGN PATENT DOCUMENTS

| | | |
|---|---|---|
| CN | 200950441 | 9/2007 |
| CN | 101246912 | 8/2008 |
| | (Continued) | |

OTHER PUBLICATIONS

"Office Action of China Counterpart Application" with English translation thereof, issued on Jul. 5, 2023, p. 1-p. 20.
(Continued)

*Primary Examiner* — Dustin Q Dam
(74) *Attorney, Agent, or Firm* — JCIPRNET

(57) ABSTRACT

The present disclosure discloses a thin film photovoltaic cell, a cell pack and a method for fabricating the thin film photovoltaic cell, a film layer structure of the thin film photovoltaic cell is arranged in sequential attachment by: a transparent electrode, a transparent substrate, a thin film photovoltaic layer, a first metal electrode layer, an insulating layer, a second metal electrode layer, and a protective layer; the thin film photovoltaic cell includes a power generation region, a positive electrode and a negative electrode, the positive electrode and the negative electrode are respectively arranged at both ends of the power generation region; a plurality of first via structure patterns are arranged in the power generation region of the thin film photovoltaic cell, and in the power generation region of the thin film photovoltaic cell, the transparent electrode is connected to the second metal electrode layer with the first via structure patterns.

10 Claims, 6 Drawing Sheets

(56) References Cited

U.S. PATENT DOCUMENTS

| | | | |
|---|---|---|---|
| 2016/0126407 A1 | 5/2016 | Cardi et al. | |
| 2020/0343395 A1 | 10/2020 | Cardi et al. | |
| 2021/0074870 A1* | 3/2021 | Sui | H01L 31/0465 |
| 2021/0242359 A1 | 8/2021 | Bouchoucha | |
| 2021/0408304 A1* | 12/2021 | Sui | H01L 31/1888 |

FOREIGN PATENT DOCUMENTS

| | | |
|---|---|---|
| CN | 104600148 | 5/2015 |
| CN | 110164991 | 8/2019 |
| CN | 110176506 | 8/2019 |
| CN | 110518079 | 11/2019 |
| CN | 112331640 | 2/2021 |
| DE | 102014015911 | 5/2016 |
| TW | 202046510 | 12/2020 |
| TW | M623363 | 2/2022 |

OTHER PUBLICATIONS

"Notice of Allowance of China Counterpart Application," issued on Aug. 31, 2023, p. 1-p. 4.
"Search Report of Europe Counterpart Application", issued on Apr. 15, 2024, p. 1-p. 14.
"Office Action of Taiwan Counterpart Application", issued on Mar. 28, 2024, p. 1-p. 7.

\* cited by examiner

THIN FILM PHOTOVOLTAIC CELL, CELL PACK AND METHOD OF FABRICATING THIN FILM PHOTOVOLTAIC CELL

CROSS-REFERENCE TO RELATED APPLICATION

This application claims the priority benefit of China application serial no. 202211480155.0, filed on Nov. 23, 2022. The entirety of the above-mentioned patent application is hereby incorporated by reference herein and made a part of this specification.

BACKGROUND

Technical Field

The present disclosure relates to the technical field of photovoltaic cells, in particular to a thin film photovoltaic cell, a cell pack and a method of fabricating the thin film photovoltaic cell.

Description of Related Art

With the increasing demand for energy and the continuous development of thin film photovoltaic cell technology, thin film photovoltaic cells are applied to display modules (such as wearable electronic products), and the technology of supplying power to display modules by using the principle of light conversion to electricity is more and more widely used.

However, due to the low photoelectric conversion efficiency and complicated manufacturing process of the current thin film photovoltaic technology, its application in wearable, low power and other low power consumption products is less.

In the prior art, the front electrode of the thin film photovoltaic cell is usually made of transparent metal oxide, and its metal film layer has relatively large resistance. In order to prevent excessive resistance from affecting the conversion efficiency, the traditional thin film photovoltaic cell produces a total gate electrode with a metal film layer and leads the front electrode to the total gate electrode, as shown in FIG. 1 and FIG. 2, and the current is led out to the positive electrode 11 and the negative electrode 12 through the total gate electrode 82 and the total gate electrode 81. Although it plays a role in reducing the resistance, the total gate electrode 82, the total gate electrode 81 and the positive electrode 11 and the negative electrode 12 cannot generate electric energy and occupy a part of the area of the thin film photovoltaic cell.

In the Chinese patent application CN2019104715896, a thin film photovoltaic layer and a rear metal electrode are wrapped in an insulating layer, a front transparent electrode is phase-connected with a second metal layer, but a total gate electrode at the periphery thereof is not available for power generation, resulting in an reduced effective area of the thin film photovoltaic cell that can generate power, and the conversion efficiency and generation power of the thin film photovoltaic cell are reduced.

SUMMARY

The existing thin film photovoltaic cell has less effective power generation area per unit area, resulting in low conversion efficiency and generation power.

Aiming at the above problems, a thin film photovoltaic cell, a cell pack and a method of fabricating a thin film photovoltaic cell are provided. A plurality of first via structure patterns are arranged in a power generation area of the thin film photovoltaic cell, and in the power generation area of the thin film photovoltaic cell, a transparent electrode is connected to a second metal electrode layer by using the first via structure patterns, thereby reducing the resistance of the transparent electrode. Compared with the traditional thin film photovoltaic cell structure, additional auxiliary electrode traces can be avoided, and the positive and negative electrodes of the thin film photovoltaic cell can normally participate in power generation by correspondingly connecting respective film layers of the positive electrode and the negative electrode with respective film layers of the power generation area, thus improving the effective power generation area and conversion efficiency of the thin film photovoltaic cell.

In a first aspect, there is provided a thin film photovoltaic cell having a membrane layer structure arranged in sequential attachment by:
  a transparent substrate;
  a transparent electrode;
  a thin film photovoltaic layer;
  a first metal electrode layer;
  an insulating layer;
  a second metal electrode layer; and
  a protective layer,
  the thin film photovoltaic cell includes a power generation region, a positive electrode and a negative electrode, wherein the positive electrode and the negative electrode are respectively arranged at both ends of the power generation region, and:
  the power generation region includes first via structure patterns, a transparent electrode layer and the second metal electrode layer in the power generation region are lap-jointed by the first via structure patterns, and the second metal electrode layer passes through the first metal electrode layer and the thin film photovoltaic layer and is insulated from the first metal electrode layer and the thin film photovoltaic layer;
  the transparent electrode, the thin film photovoltaic layer, the first metal electrode layer, the insulating layer and the second metal electrode layer in the positive electrode are correspondingly connected with respective film layers in the power generation region, and the transparent electrode, the thin film photovoltaic layer and the first metal electrode layer in the negative electrode are correspondingly connected with the respective film layers in the power generation region; and
  the negative electrode includes a first opening structure and a second via structure pattern arranged on the insulating layer, the negative electrode is separated from the second metal electrode layer in the power generation region by the first opening structure, and the first metal electrode layer in the negative electrode and the second metal electrode layer are lap-jointed by the second via structure pattern.

In a first possible implementation mode of a thin film photovoltaic cell according to the first aspect of the disclosure, the power generation region includes a plurality of first via structure patterns, and
  the plurality of first via structure patterns are arranged in the power generation region for lap-jointing and conducting the transparent electrode at a plurality of points in the power generation region and the second metal electrode layer.

With reference to the first possible implementation mode of the first aspect of the present disclosure, in a second possible implementation mode, the first via structure pattern is formed by following steps:
  arranging first hole patterns coincident in center on the first metal electrode layer and the thin film photovoltaic layer; and
  arranging a second hole pattern slightly smaller than the first hole pattern but coincident in center and covering the surrounding first metal electrode layer and the thin film photovoltaic layer on the insulating layer.

With reference to the second possible implementation mode of the first aspect of the present disclosure, in a third possible implementation mode, the thin film photovoltaic cell is arc-shaped.

In a second aspect, a thin film photovoltaic cell pack includes:
  a plurality of the thin film photovoltaic cells according to the first aspect; and
  a plurality of the thin film photovoltaic cells are connected in series to form a thin film photovoltaic cell pack.

With reference to the thin film photovoltaic cell pack of the second aspect of the present disclosure, in a possible implementation mode, the thin film photovoltaic cell pack is in a shape of an annular cell pack.

In a third aspect, a method of fabricating a thin film photovoltaic cell, includes:
  step 100, arranging a transparent substrate, a transparent electrode, a thin film photovoltaic layer, a first metal electrode layer, an insulating layer, a second metal electrode layer and a protective layer in sequential attachment to obtain a photovoltaic cell body;
  step 200, making first via structure patterns, lap-jointing the transparent electrode layer and the second metal electrode layer in the power generation region;
  step 300, connecting the transparent electrode, the thin film photovoltaic layer, the first metal electrode layer, the insulating layer, the second metal electrode layer in the positive electrode with the respective film layers in the power generation region correspondingly, connecting the transparent electrode, the thin film photovoltaic layer, the first metal electrode layer in the negative electrode with the respective film layers in the power generation region correspondingly; and
  step 400, fabricating a second via structure pattern and a first opening structure, separating the negative electrode from the second metal electrode layer in the power generation region through the first opening structure, and lap-jointing the first metal electrode layer in the negative electrode and the second metal electrode layer through the second via structure pattern.

With reference to the method of manufacturing a thin film photovoltaic cell according to the third aspect, in a first possible implementation mode, the process further includes:
  step 500, connecting a plurality of the thin film photovoltaic cells in series to form a thin film photovoltaic cell pack.

With reference to the first possible implementation mode of the third aspect of the present disclosure, in a second possible implementation mode, the step 200 includes: step 210, arranging first hole patterns coincident in center on the first metal electrode layer and the thin film photovoltaic layer;

step 220, arranging a second hole pattern slightly smaller than the first hole pattern but coincident in center and covering the surrounding first metal electrode layer and the thin film photovoltaic layer on the insulating layer; and
step 230, making the first via structure pattern using the first hole patterns and the second hole pattern.

With reference to the second possible implementation mode of the third aspect of the present disclosure, in a third possible implementation mode, the thin film photovoltaic cell in step 500 is arc-shaped, and the thin film photovoltaic cell pack is annular-shaped.

The present disclosure discloses a thin film photovoltaic cell, a cell pack and a method for fabricating the thin film photovoltaic cell, a plurality of first via structure patterns are arranged through the power generation region of the thin film photovoltaic cell, the transparent electrode is connected to the second metal electrode layer with the first via structure patterns, thereby reducing the resistance of the transparent electrode, compared to a conventional thin film photovoltaic cell structure, additional auxiliary electrode traces can be eliminated, and the positive and negative electrodes of the thin film photovoltaic cell can also normally participate in power generation by connecting the respective film layers in the positive electrode and the negative electrode to the respective film layers in the power generation region, thereby improving the effective power generation area and the conversion efficiency of the thin film photovoltaic cell.

BRIEF DESCRIPTION OF THE DRAWINGS

To illustrate the technical solutions in the embodiments of the present disclosure more clearly, the accompanying drawings required for use in the description of the embodiments will be briefly described below, and it is obvious that the accompanying drawings in the following description are only some embodiments of the present disclosure, and other drawings can be obtained from these drawings for those skilled in the art without inventive step.

DESCRIPTION OF THE EMBODIMENTS

The technical solutions in the present disclosure will be clearly and completely described below in conjunction with the accompanying drawings in the present disclosure, and it is obvious that the described embodiments are only a part of the embodiments of the present disclosure, rather than all of the embodiments. Based on the embodiments in the present disclosure, other embodiments obtained by those of ordinary skill in the art without paying inventive step, belong to the scope of protection of the present disclosure.

Unless defined otherwise, all technical and scientific terms used herein have the same meaning as commonly understood by those of ordinary skill in the art to which this disclosure belongs. The terms used in the description of the disclosure herein are for the purpose of describing particular embodiments only and are not intended to limit the disclosure. As used herein, the term "and/or" includes any and all combinations of one or more of the associated listed items.

The existing thin film photovoltaic cell has less effective power generation area per unit area, resulting in low conversion efficiency and generation power.

In view of the above problems, a thin film photovoltaic cell, a cell pack and a method of fabricating the thin film photovoltaic cell are provided.

Embodiment 1

Figure 1:
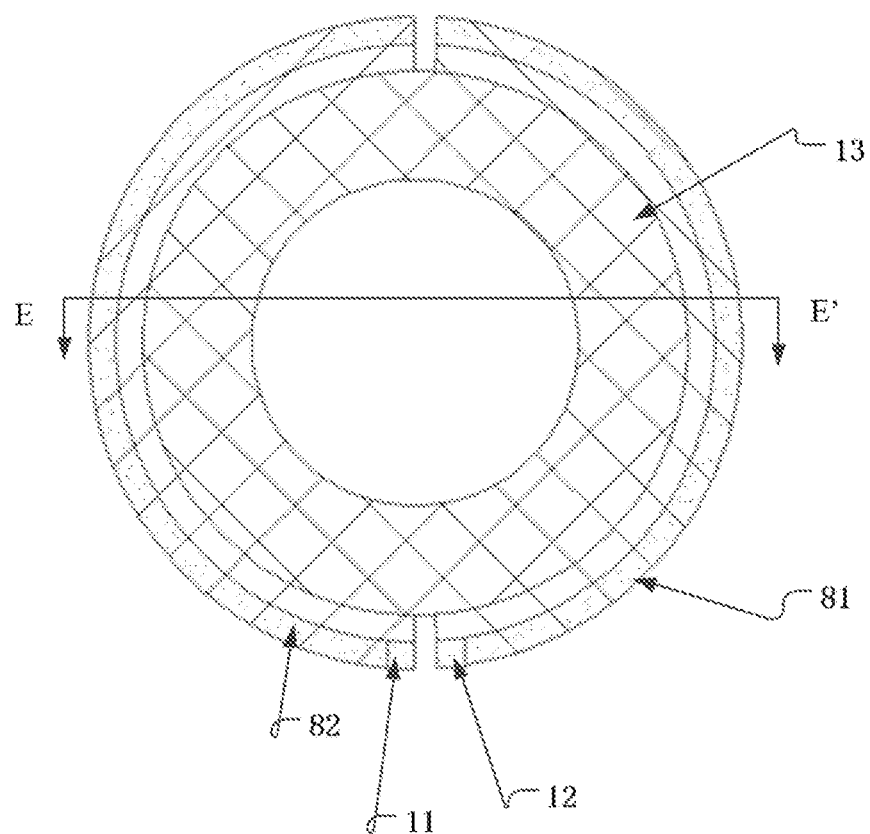
FIG. 1 is a schematic diagram of a thin film photovoltaic cell in the prior art.
Figure 2:
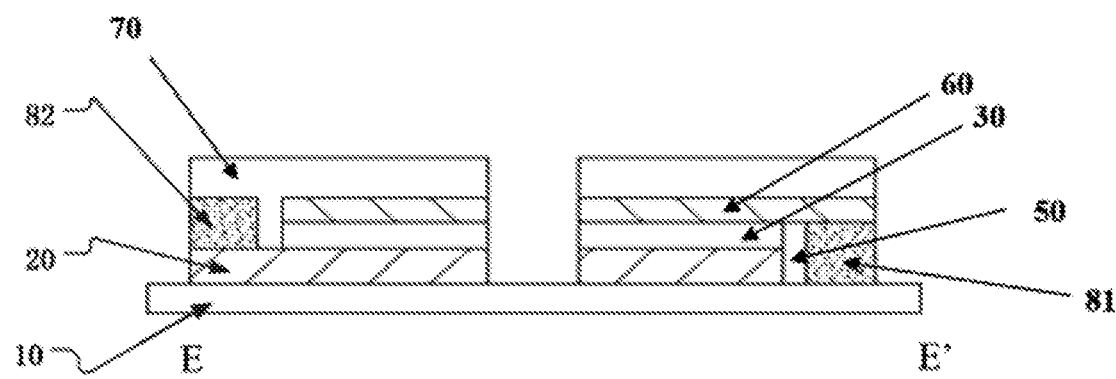
FIG. 2 is a cross-sectional schematic diagram of the thin film photovoltaic cell in the prior art.
Figure 3:
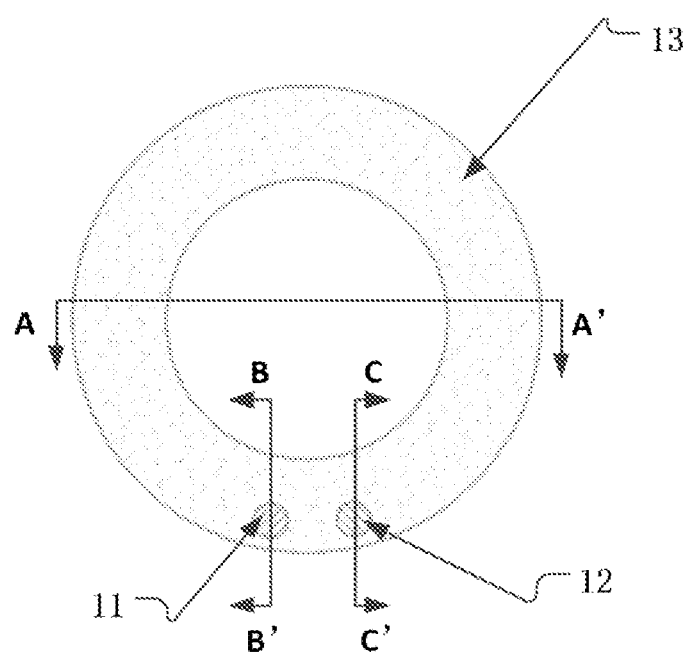
FIG. 3 is a schematic diagram of the thin film photovoltaic cell according to the present disclosure.

As shown in FIG. 3 which is a schematic diagram of a thin film photovoltaic cell according to the present disclosure, a film layer structure of the thin film photovoltaic cell is arranged in sequential attachment by: a transparent substrate 10, a transparent electrode 20, a thin film photovoltaic layer 30, a first metal electrode layer 40, an insulating layer 50, a second metal electrode layer 60 and a protective layer 70; the thin film photovoltaic cell includes a power generation region 13, a positive electrode 11 and a negative electrode 12, the positive electrode 11 and the negative electrode 12 being arranged at both ends of the power generation region 13, respectively.

Figure 4:
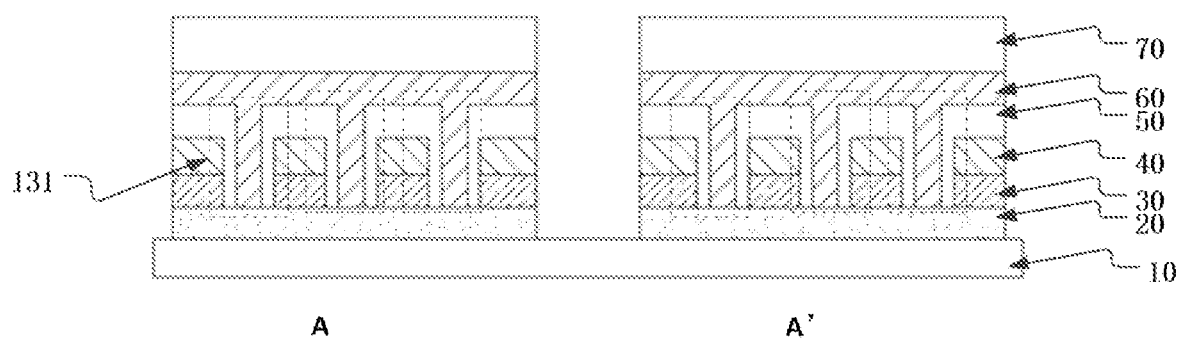
FIG. 4 is a first cross-sectional schematic diagram of the thin film photovoltaic cell according to the present disclosure.

As shown in FIG. 4 which is a first cross-sectional schematic diagram of a thin film photovoltaic cell according to the present disclosure, the film layer structure therein may be, from bottom to top, a transparent substrate 10, a transparent electrode 20, a thin film photovoltaic layer 30, a first metal electrode layer 40, an insulating layer 50, a second metal electrode layer 60 and a protective layer 70 in this order. In a surface structure, the thin film photovoltaic cell in this embodiment can be divided into three regions: a power generation region 13, a positive electrode 11, and a negative electrode 12. The positive electrode 11 and the negative electrode 12 are used to output holes and electrons, respectively.

The power generation region 13 in this embodiment includes first via structure patterns 131 through which the transparent electrode 20 layer in the power generation region 13 is lap-jointed with the second metal electrode layer 60, and the second metal electrode layer 60 passes through the first metal electrode layer 40 and the thin film photovoltaic layer 30 and is insulated from the first metal electrode layer 40 and the thin film photovoltaic layer 30.

A plurality of first via structure patterns 131 are distributed in the power generation region 13 of the thin film photovoltaic cell, and the power generation region 13 includes the plurality of first via structure patterns 131. The plurality of first via structure patterns 131 are arranged in the power generation region 13 for lap-jointing and conducting the transparent electrode 20 at a plurality of points in the power generation region 13 and the second metal electrode layer 60. The first via structure pattern is formed by the following steps: first hole patterns coincident in center are arranged on the first metal electrode layer 40 and the thin film photovoltaic layer, and a second hole pattern slightly smaller than the first hole pattern but coincident in center and covering the surrounding first metal electrode layer 40 and the thin film photovoltaic layer is then arranged on the insulating layer 50.

This first via structure pattern 131 can be realized by making a hole pattern to the thin film photovoltaic layer 30, the second metal electrode layer 60 and the insulating layer 50, and the specific implementation mode is as follows:

first hole patterns are made in the thin film photovoltaic layer 30 and the first metal electrode layer 40, then a second hole pattern of the insulating layer 50 is made, the center of the second hole pattern of the insulating layer 50 coincides with the centers of the first hole patterns of the thin film photovoltaic layer 30 and the first metal electrode layer 40, and the size of the second hole pattern of the insulating layer 50 is slightly smaller than the sizes of the first hole patterns of the thin film photovoltaic layer 30 and the first metal electrode layer 40, the second hole pattern of the insulating layer 50 is enabled to completely cover the sides of the thin film photovoltaic layer 30 and the first metal electrode layer 40, so that the second metal electrode layer 60 is completely isolated from the thin film photovoltaic layer 30 and the first metal electrode layer 40, thereby forming the first via structure pattern 131. The transparent anode conducts with the second metal electrode layer 60 through the first via structure pattern 131, thereby greatly reducing the resistance.

In a preferred embodiment, the thin film photovoltaic cell is arc-shaped, and the radian can be selected from a range of 0-360 degrees.

Figure 5:
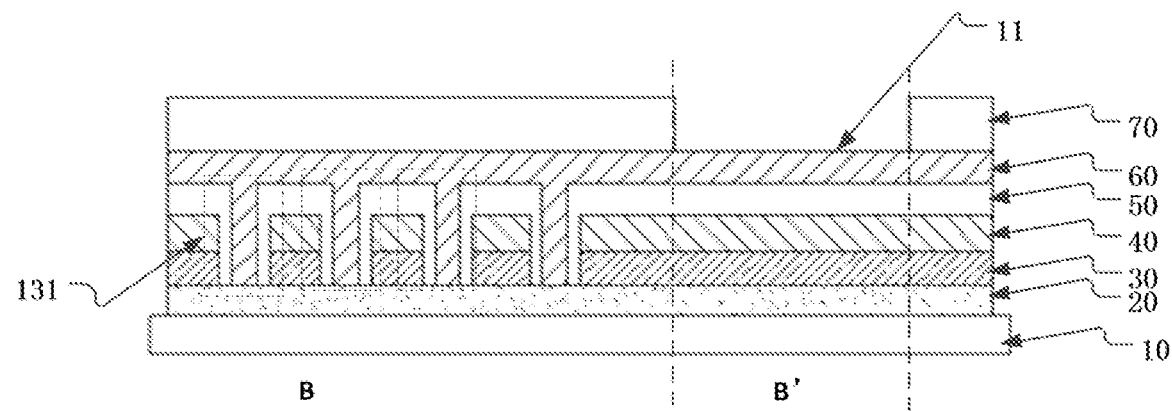
FIG. 5 is a second cross-sectional schematic diagram of the thin film photovoltaic cell according to the present disclosure.

In this embodiment, as shown in FIG. 5 which is a second cross-sectional schematic diagram of the thin film photovoltaic cell according to the present disclosure. The transparent electrode 20, the thin film photovoltaic layer 30, the first metal electrode layer 40, the insulating layer 50, the second metal electrode layer 60 in the positive electrode 11 are correspondingly connected with respective film layers in the power generation region 13, and the transparent electrode 20, the thin film photovoltaic layer 30, the first metal electrode layer 40 in the negative electrode 12 are correspondingly connected with the respective film layers in the power generation region 13.

Figure 6:
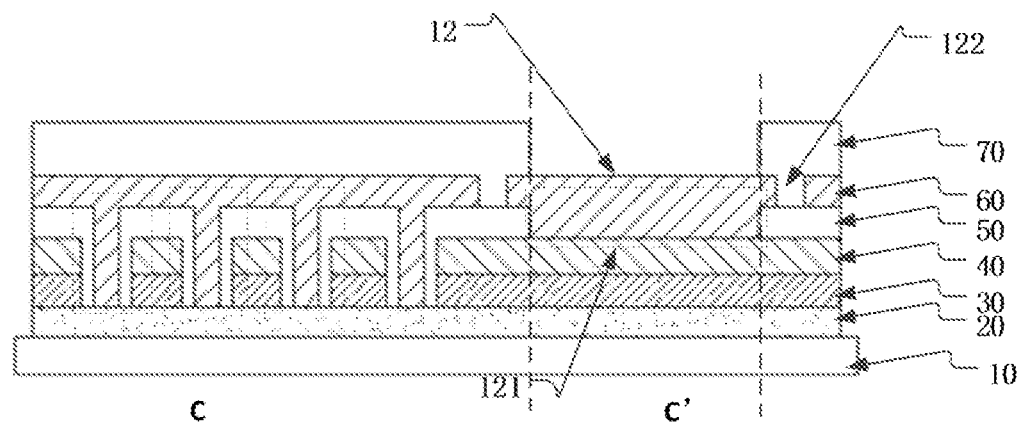
FIG. 6 is a third cross-sectional schematic diagram of the thin film photovoltaic cell according to the present disclosure.

As shown in FIG. 6 which is a third cross-sectional schematic diagram of the thin film photovoltaic cell according to the present disclosure (a cross-sectional schematic diagram of a C-C' section line in FIG. 3). The negative electrode 12 includes a first opening structure 122 through which the negative electrode 12 is separated from the second metal electrode layer 60 in the power generation region 13, and a second via structure pattern 121 arranged on the insulating layer 50 through which the first metal electrode layer 40 in the negative electrode 12 and the second metal electrode layer 60 are lap-jointed.

The transparent electrode 20 transfers holes generated by the thin film photovoltaic layer 30 onto the second metal electrode layer 60 through the first via structure patterns 131, the holes include holes generated by the power generation region 13 and the positive electrode 11, and the second metal electrode layer 60 conducts the holes to the region not covered by the protective layer 70 (i.e., an output/connection terminal of the positive electrode), through which the holes are transferred out of the thin film photovoltaic cell.

The second metal electrode layer 60 of the negative electrode 12 is separated from the second metal electrode layer 60 of the power generation region 13, so that holes generated from the positive electrode are not transferred to the second metal electrode layer 60 of the negative electrode 12. The second metal electrode layer 60 of the negative electrode 12 region is connected with the first metal electrode layer 40, whereas the first metal electrode layer 40 is correspondingly connected with the first metal electrode layer 40 of the power generation region 13, thus, electrons generated by the thin film photovoltaic layer 30 are transferred through the first metal electrode layer 40 to the second metal electrode layer 60 of the negative electrode 12, and a portion of the region of the second metal electrode layer 60 of the negative electrode 12 (i.e., the output/connection terminal of the negative electrode), through which the electrons are transferred out of the thin film photovoltaic cell, is not covered by the protective layer 70. The plurality of first via structure patterns 131 are arranged through the power generation region 13 of the thin film photovoltaic cell, the transparent electrode 20 is connected to the second metal electrode layer 60 with the first via structure patterns 131, thereby reducing the resistance of the transparent electrode 20, compared to a conventional thin film photovoltaic cell structure, additional auxiliary electrode traces can be eliminated, and the positive and negative electrodes 11, 12 of the thin film photovoltaic cell can also normally participate in power generation by connecting the respective film layers in the positive electrode 11 and the negative electrode 12 to the respective film layers in the power generation region 13, thereby improving the effective power generation area and the conversion efficiency of the thin film photovoltaic cell.

Embodiment 2

Figure 7:
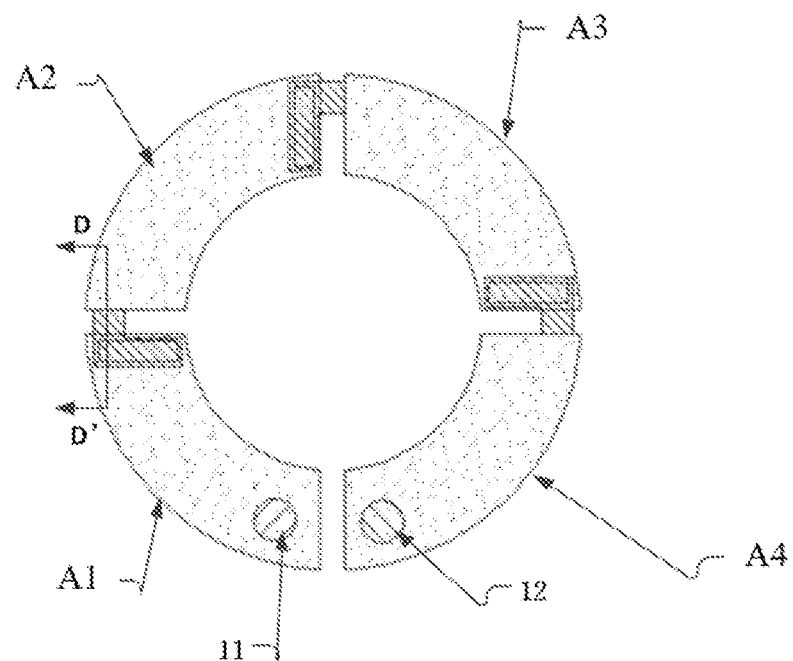
FIG. 7 is a schematic diagram of a thin film photovoltaic cell pack according to the present disclosure.

A thin film photovoltaic cell pack, as shown in FIG. 7 which is a schematic diagram of a thin film photovoltaic cell pack according to the present disclosure, includes: a plurality of thin film photovoltaic cells of the first aspect, and a plurality of thin film photovoltaic cells are connected in series to form a thin film photovoltaic cell pack, including a first thin film photovoltaic cell section A1, a second thin film photovoltaic cell section A2, a third thin film photovoltaic cell section A3, and a fourth thin film photovoltaic cell section A4.

In the structure of the thin film photovoltaic cell pack of the present embodiment, the power generation region 13 is formed by a plurality of cell sections in series, and the thin film photovoltaic cell sections are connected to each other via the second metal electrode layer 60. A specific implementation mode of the thin film photovoltaic cell pack may be as follows.

Figure 8:
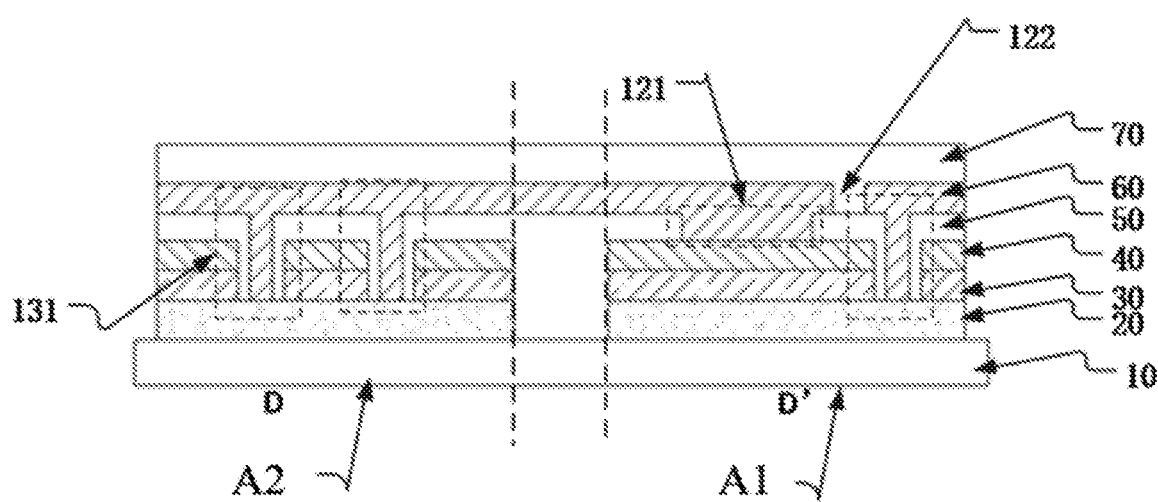
FIG. 8 is a first cross-sectional schematic diagram of the thin film photovoltaic cell pack according to the present disclosure.

As shown in FIG. 8 which is a first cross-sectional schematic diagram of the thin film photovoltaic cell pack according to the present disclosure (a cross-sectional schematic diagram of a D-D' section line in FIG. 7). At a region of the first thin film photovoltaic cell section A1 close to the second thin film photovoltaic cell section A2, the second metal electrode layer 60 is provided with the first opening structure 122 which divides the second metal electrode layer 60 on the insulating layer 50 into two parts. One part is connected with the transparent electrode 20 through the first via structure patterns 131 to form the positive electrode 11, the other part is connected with the first metal electrode layer 40 of the first thin film photovoltaic cell section A1 to form a lead-out line of the negative electrode 12 of the first thin film photovoltaic cell section A1, and extends on the insulating layer 50 to the second thin film photovoltaic cell section A2. The other part is connected with the transparent electrode 20 through the first via structure patterns 131, therefore, the purpose of connecting the negative electrode 12 of the first thin film photovoltaic cell section A1 with the positive electrode 11 of the second thin film photovoltaic cell section A2 is achieved, and the series connection of the thin film photovoltaic cell sections is realized and most importantly, the power generation regions 13 of both the first thin film photovoltaic cell section A1 and the second thin film photovoltaic cell section A2 are not destroyed and can normally generate power.

In a preferred embodiment, the thin film photovoltaic cell pack is in the shape of an annular cell pack.

Embodiment 3

Figure 9:
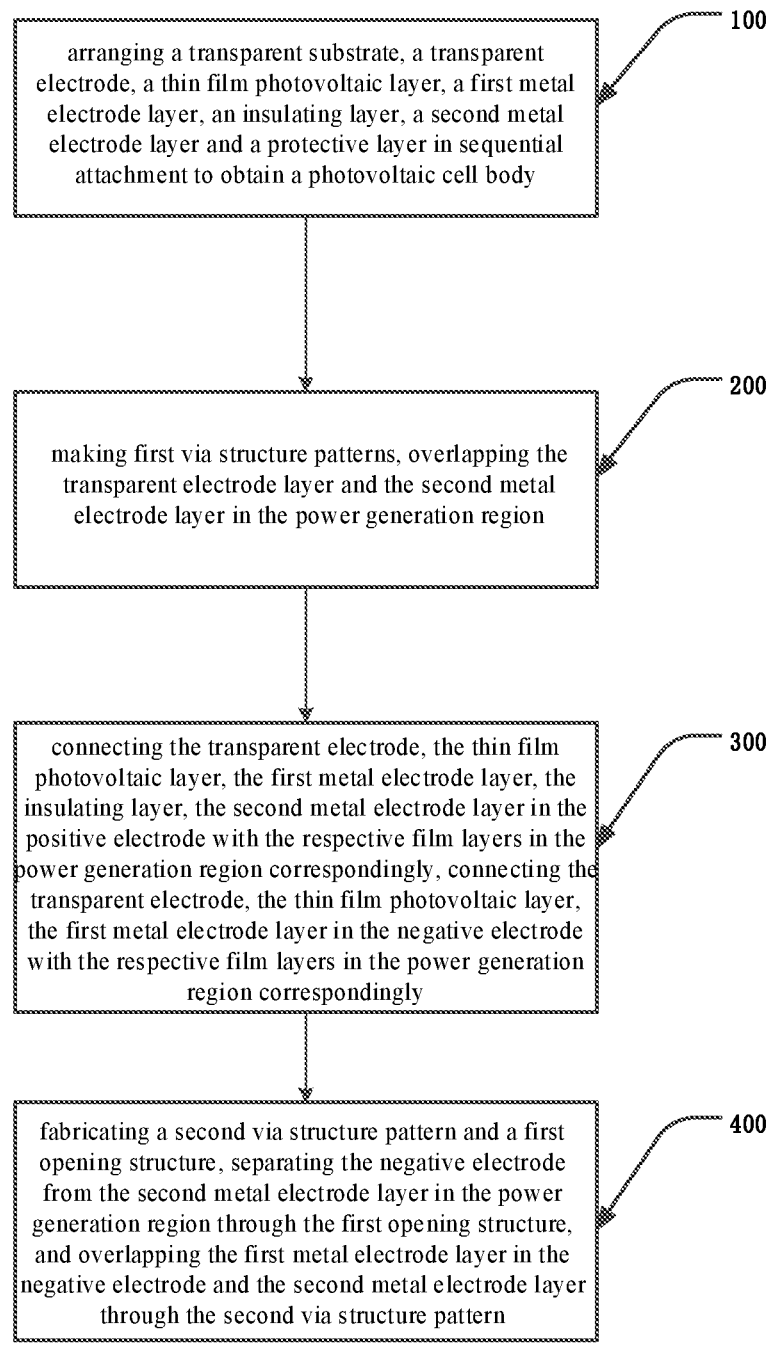
FIG. 9 is a first schematic diagram of a method of fabricating the thin film photovoltaic cell according to the present disclosure.

Preferably, as shown in FIG. 9 which is a first schematic diagram of a method of fabricating the thin film photovoltaic cell according to the present disclosure, the method of fabricating the thin film photovoltaic cell includes: step 100, a transparent substrate 10, a transparent electrode 20, a thin film photovoltaic layer 30, a first metal electrode layer 40, an insulating layer 50, a second metal electrode layer 60 and a protective layer 70 are arranged in sequential attachment to obtain a photovoltaic cell body.

Figure 10:
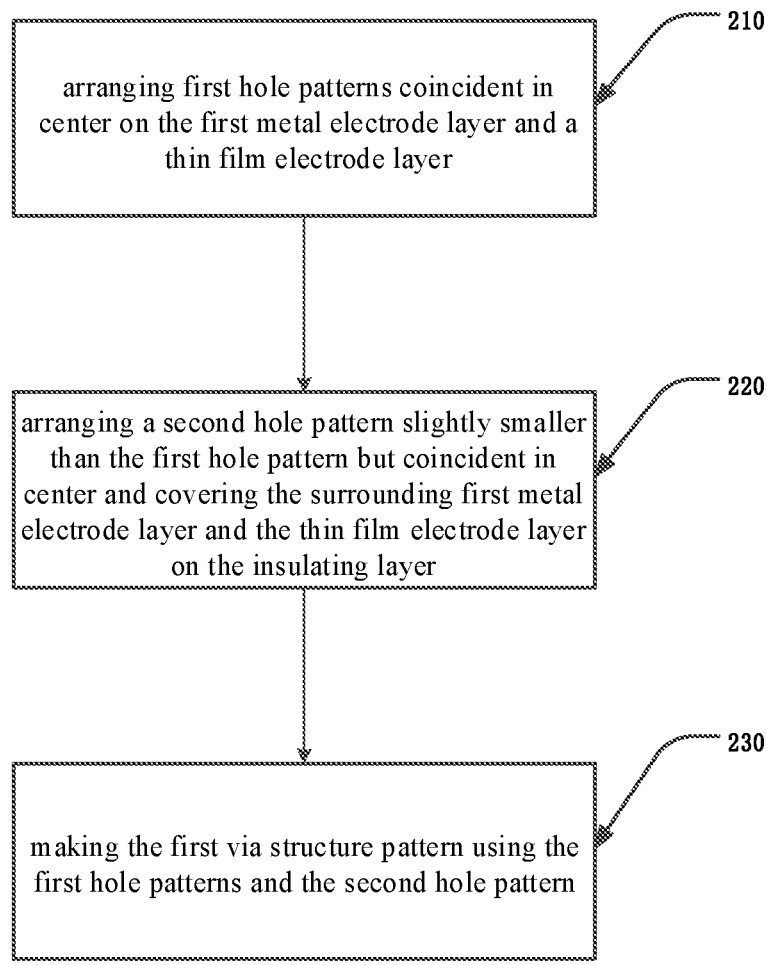
FIG. 10 is a second schematic diagram of the method of fabricating the thin film photovoltaic cell according to the present disclosure.

Step 200, first via structure patterns 131 are made, the transparent electrode 20 layer in the power generation region 13 is lap-jointed with the second metal electrode layer 60. Preferably, as shown in FIG. 10 which is a second schematic diagram of the method for fabricating the thin film photovoltaic cell according to the present disclosure, step 200 includes:

Step 210, first hole patterns coincident in center are arranged on the first metal electrode layer 40 and the thin film photovoltaic layer; step 220, a second hole pattern slightly smaller than the first hole pattern but coincident in center and covering the surrounding first metal electrode layer 40 and thin film photovoltaic layer is arranged on the insulating layer 50; step 230, a first via structure pattern is made 131 using the first hole patterns and the second hole pattern.

Step 300, the transparent electrode 20, the thin film photovoltaic layer 30, the first metal electrode layer 40, the insulating layer 50, the second metal electrode layer 60 in the positive electrode 11 are connected with the respective film layers in the power generation region 13 correspondingly, the transparent electrode 20, the thin film photovoltaic layer 30, the first metal electrode layer 40 in the negative electrode 12 are connected with the respective film layers in the power generation region 13 correspondingly; step 400, a second via structure pattern 121 and a first opening structure 122 are fabricated, the negative electrode 12 is separated from the second metal electrode layer 60 in the power generation region 13 through the first opening structure 122, and the first metal electrode layer 40 in the negative electrode 12 and the second metal electrode layer 60 are lap-jointed through the second via structure pattern 121.

Embodiment 4

In this Embodiment 4, the thin film photovoltaic cells of Embodiment 1 are connected in series to form a cell pack.

Preferably, a step 500 that a plurality of thin film photovoltaic cells are connected in series to form a thin film photovoltaic cell pack is included. At a region of the first thin film photovoltaic cell section A1 close to the second thin film photovoltaic cell section A2, the second metal electrode layer 60 has a first opening structure 122 that divides the second metal electrode layer 60 on the insulating layer 50 into two parts. One part is connected to the transparent electrode 20 through the first via structure patterns 131 to form the positive electrode 11, and the other part is connected to the first metal electrode layer 40 of the first thin film photovoltaic cell section A1 to form a lead-out line of the negative electrode 12 of the first thin film photovoltaic cell section A1. The other part extends on the insulating layer 50 to the second thin film photovoltaic cell section A2 and is connected to the transparent electrode 20 through the first via structure patterns 131, therefore, it is achieved that the negative electrode 12 of the first thin film photovoltaic cell section A1 is connected to the positive electrode 11 of the second thin film photovoltaic cell section A2.

In a preferred embodiment, the thin film photovoltaic cell is arc-shaped and the thin film photovoltaic cell is annular-shaped.

The present disclosure discloses a thin film photovoltaic cell, a cell pack and a method for fabricating the thin film photovoltaic cell, a plurality of first via structure patterns 131 are arranged through the power generation region of the thin film photovoltaic cell, the transparent electrode 20 is connected to the second metal electrode layer 60 with the first via structure patterns 131, thereby reducing the resistance of the transparent electrode 20, compared to a conventional thin film photovoltaic cell structure, additional auxiliary electrode traces can be eliminated, and the positive and negative electrodes 11, 12 of the thin film photovoltaic cell can also normally participate in power generation by connecting the respective film layers in the positive electrode 11 and the negative electrode 12 to the respective film layers in the power generation region 13, thereby improving the effective power generation area and the conversion efficiency of the thin film photovoltaic cell.

The above are only preferred embodiments of the present disclosure and are not intended to limit the present disclosure, and any modifications, equivalents, improvements, etc. within the spirit and principles of the present disclosure are intended to be included within the scope of the present disclosure.

What is claimed is:

1. A thin film photovoltaic cell, wherein a film layer structure thereof is arranged in sequential attachment by:
    a transparent substrate;
    a transparent electrode;
    a thin film photovoltaic layer;
    a first metal electrode layer;
    an insulating layer;
    a second metal electrode layer; and
    a protective layer,
    the thin film photovoltaic cell comprises a power generation region, a positive electrode and a negative electrode, wherein the positive electrode and the negative electrode are respectively arranged at both ends of the power generation region, and:
    the power generation region comprises first via structure patterns, and through the first via structure patterns, a transparent electrode layer and the second metal electrode layer in the power generation region are lap-jointed, and the second metal electrode layer is insulated from the thin film photovoltaic layer and the first metal electrode layer being passed;
    the transparent electrode, the thin film photovoltaic layer, the first metal electrode layer, the insulating layer and the second metal electrode layer in the positive electrode are correspondingly connected with respective film layers in the power generation region, and the transparent electrode, the thin film photovoltaic layer and the first metal electrode layer in the negative electrode are correspondingly connected with the respective film layers in the power generation region; and
    the negative electrode comprises a first opening structure and a second via structure pattern arranged on the insulating layer, the second metal electrode layer in the negative electrode is separated from the second metal electrode layer in the power generation region by the first opening structure, and the first metal electrode layer in the negative electrode and the second metal electrode layer are lap-jointed by the second via structure pattern,
    wherein the first opening structure divides the second metal electrode layer on the insulating layer into a first part directly on and in contact with the second via structure pattern in the negative electrode and a second part separated from the first part by the first opening structure surrounding the first part and connected to the transparent electrode through the first via structure patterns in the power generation region, and
    wherein the protective layer is filled in the first opening structure and comprises an opening exposing the first part.

2. The thin film photovoltaic cell according to claim 1, wherein the power generation region comprises a plurality of first via structure patterns; and
    the plurality of first via structure patterns are arranged in the power generation region for lap-jointing and conducting the transparent electrode at a plurality of points in the power generation region to the second metal electrode layer.

3. The thin film photovoltaic cell according to claim 2, wherein the first via structure patterns are formed by following steps:
    arranging first hole patterns coincident in center on the first metal electrode layer and the thin film photovoltaic layer; and
    arranging a second hole pattern slightly smaller than the first hole pattern but coincident in center and covering the surrounding first metal electrode layer and the thin film photovoltaic layer on the insulating layer.

4. The thin film photovoltaic cell according to claim 3, wherein the thin film photovoltaic cell is arc-shaped.

5. A thin film photovoltaic cell pack, comprising:
    a plurality of the thin film photovoltaic cells comprising a first thin film photovoltaic cell section and a second thin film photovoltaic cell section, wherein a film layer structure of each of the first thin film photovoltaic cell section and the second thin film photovoltaic cell section is arranged in sequential attachment by:
    a transparent substrate;
    a transparent electrode;
    a thin film photovoltaic layer;
    a first metal electrode layer;
    an insulating layer;
    a second metal electrode layer; and
    a protective layer,
    the thin film photovoltaic cells are arc-shaped and comprise a power generation region formed by the first thin film photovoltaic cell section and the second thin film photovoltaic cell section in series, a positive electrode and a negative electrode, wherein the positive electrode and the negative electrode are respectively arranged at both ends of the power generation region, and:

the power generation region comprises first via structure patterns, and through the first via structure patterns, a transparent electrode layer and the second metal electrode layer in the power generation region are lap-jointed, and the second metal electrode layer is insulated from the thin film photovoltaic layer and the first metal electrode layer being passed;

the transparent electrode, the thin film photovoltaic layer, the first metal electrode layer, the insulating layer and the second metal electrode layer in the positive electrode are correspondingly connected with respective film layers in the power generation region, and the transparent electrode, the thin film photovoltaic layer and the first metal electrode layer in the negative electrode are correspondingly connected with the respective film layers in the power generation region; and the negative electrode comprises a first opening structure and a second via structure pattern arranged on the insulating layer, the second metal electrode layer in the negative electrode is separated from the second metal electrode layer in the power generation region by the first opening structure, and the first metal electrode layer in the negative electrode and the second metal electrode layer are lap-jointed by the second via structure pattern, and the plurality of the thin film photovoltaic cells are connected in series to form a thin film photovoltaic cell pack, wherein the first thin film photovoltaic cell section and the second thin film photovoltaic cell section are connected to each other through the second metal electrode layer, at a region of the first thin film photovoltaic cell section close to the second thin film photovoltaic cell section, the second metal electrode layer is provided with the first opening structure, which divides the second metal electrode layer on the insulating layer into a first part and a second part, the first part is connected with the transparent electrode through the first via structure patterns to form the positive electrode, and the second part is connected with the first metal electrode layer of the first thin film photovoltaic cell section to form a lead-out line of the negative electrode of the first thin film photovoltaic cell section, and extends on the insulating layer to the second thin film photovoltaic cell section, and the second part is connected with the transparent electrode through the first via structure patterns, so as to connect the negative electrode of the first thin film photovoltaic cell section with the positive electrode of the second thin film photovoltaic cell section.

6. The thin film photovoltaic cell pack according to claim 5, wherein the thin film photovoltaic cell pack is in a shape of an annular cell pack.

7. A method of fabricating a thin film photovoltaic cell, comprising:
step 100, arranging a transparent substrate, a transparent electrode, a thin film photovoltaic layer, a first metal electrode layer, an insulating layer, a second metal electrode layer and a protective layer in sequential attachment to obtain a photovoltaic cell body;
step 200, fabricating first via structure patterns, lap-jointing the transparent electrode layer to the second metal electrode layer in a power generation region;
step 300, connecting the transparent electrode, the thin film photovoltaic layer, the first metal electrode layer, the insulating layer, the second metal electrode layer in a positive electrode with the respective film layers in the power generation region correspondingly, connecting the transparent electrode, the thin film photovoltaic layer, the first metal electrode layer in a negative electrode with the respective film layers in the power generation region correspondingly; and
step 400, fabricating a second via structure pattern and a first opening structure, separating the negative electrode from the second metal electrode layer in the power generation region through the first opening structure, and lap-jointing the first metal electrode layer in the negative electrode to the second metal electrode layer through the second via structure pattern,
wherein the first opening structure divides the second metal electrode layer on the insulating layer into a first part directly on and in contact with the second via structure pattern in the negative electrode and a second part separated from the first part by the first opening structure surrounding the first part and connected to the transparent electrode through the first via structure patterns in the power generation region, and
wherein the protective layer is filled in the first opening structure and comprises an opening exposing the first part.

8. The method of fabricating a thin film photovoltaic cell according to claim 7, further comprising:
step 500, connecting a plurality of the thin film photovoltaic cells in series to form a thin film photovoltaic cell pack.

9. The method of fabricating a thin film photovoltaic cell according to claim 8, wherein the step 200 comprises:
step 210, arranging first hole patterns coincident in center on the first metal electrode layer and the thin film photovoltaic layer;
step 220, arranging a second hole pattern slightly smaller than the first hole pattern but coincident in center and covering the surrounding first metal electrode layer and the thin film photovoltaic layer on the insulating layer; and
step 230, fabricating the first via structure pattern using the first hole patterns and the second hole pattern.

10. The method of fabricating a thin film photovoltaic cell according to claim 9, wherein the thin film photovoltaic cell is arc-shaped, and the thin film photovoltaic cell pack is annular-shaped.

* * * * *